(12) United States Patent
Fallahi et al.

(10) Patent No.: US 10,304,651 B2
(45) Date of Patent: May 28, 2019

(54) CHARGED PARTICLES ACCELERATOR APPARATUS, CHARGED PARTICLE GUN AND METHOD OF ACCELERATING CHARGED PARTICLES

(71) Applicant: Deutsches Elektronen-Synchrotron DESY, Hamburg (DE)

(72) Inventors: Arya Fallahi, Hamburg (DE); Franz Xaver Kaertner, Hamburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 145 days.

(21) Appl. No.: 15/454,442

(22) Filed: Mar. 9, 2017

(65) Prior Publication Data
US 2017/0263410 A1    Sep. 14, 2017

(30) Foreign Application Priority Data

Mar. 11, 2016 (EP) ..................................... 16000590

(51) Int. Cl.
*H01J 23/00* (2006.01)
*H01J 29/48* (2006.01)
(Continued)

(52) U.S. Cl.
CPC .......... *H01J 29/481* (2013.01); *H05H 15/00* (2013.01); *H01J 37/06* (2013.01); *H01J 37/08* (2013.01);
(Continued)

(58) Field of Classification Search
CPC ........... H05H 5/00; H05H 5/047; H01J 37/06; H01J 37/08; H01P 3/12
See application file for complete search history.

(56) References Cited

U.S. PATENT DOCUMENTS

| 4,548,771 A | * | 10/1985 | Senapati | ............ B29C 35/0261 |
| | | | | 156/73.1 |
| 4,987,346 A | * | 1/1991 | Katzschner | ............. H01J 37/08 |
| | | | | 118/723 FI |
| 2010/0033115 A1 | * | 2/2010 | Cleland | .................... H05H 5/00 |
| | | | | 315/501 |

FOREIGN PATENT DOCUMENTS

EP        3089561 A1    11/2016

OTHER PUBLICATIONS

Huang et al. (2013). High conversion efficiency, high energy terahertz pulses by optical rectification in cryogenically cooled lithium niobate. Optics letters, 38(5), 796-798.

(Continued)

*Primary Examiner* — Thuy V Tran
(74) *Attorney, Agent, or Firm* — Caesar Rivise, PC

(57) ABSTRACT

Accelerator apparatus (100) for accelerating charged particles (2) with pulsed radiation includes horn-shaped coupling device (10) with at least one horn coupler (11, 15) having input aperture (12), electrically conductive walls (13) and output aperture (14), wherein pulsed radiation is received at input aperture and focused towards output aperture, and waveguide device (20) coupled with the output aperture and configured for receiving focused pulsed radiation. Waveguide device includes injection section (21) for providing charged particles and subjecting them to acceleration by pulsed radiation in injection section, and lateral output port (23) for releasing accelerated charged particles along particle acceleration direction. The at least one horn coupler receives linearly polarized single cycle pulses (1) including broadband frequency spectrum shaped as a linearly polarized plane wave and focuses linearly polarized single cycle pulses. Waveguide device has non-resonant broadband transmission characteristic. Furthermore, (Continued)

charged particle gun and method of accelerating charged particles are described.

20 Claims, 3 Drawing Sheets

(51) Int. Cl.
| | |
|---|---|
| *H05H 15/00* | (2006.01) |
| *H01J 37/08* | (2006.01) |
| *H01J 37/06* | (2006.01) |
| *H05H 5/04* | (2006.01) |
| *H05H 5/00* | (2006.01) |
| *H01P 3/12* | (2006.01) |

(52) U.S. Cl.
CPC ............... *H01P 3/12* (2013.01); *H05H 5/00* (2013.01); *H05H 5/047* (2013.01)

(56) References Cited

OTHER PUBLICATIONS

Lloyd-Hughes et al. (2009). Coupling terahertz radiation between sub-wavelength metal-metal waveguides and free space using monolithically integrated horn antennae. Optics express, 17(20), 18387-18393.

Nanni et al. (2014). Linear electron acceleration in THz waveguides. In IPAC2014: 5th International Particle Accelerator Conference (pp. 1896-1899). Joint Accelerator Conferences Website JACoW.

Nanni et al. (2015). Terahertz-driven linear electron acceleration. Nature communications, 6, 8486: 1-8.

Wong et al. (2013). Compact electron acceleration and bunch compression in THz waveguides. Optics express, 21 (8), 9792-9806.

Yoder et al. (2005). Side-coupled slab-symmetric structure for high-gradient acceleration using terahertz power. Physical Review Special Topics—Accelerators and Beams, 8(11), 111301: 1-9.

European Search Report from corresponding EP 16000590 dated Jul. 14, 2016.

* cited by examiner

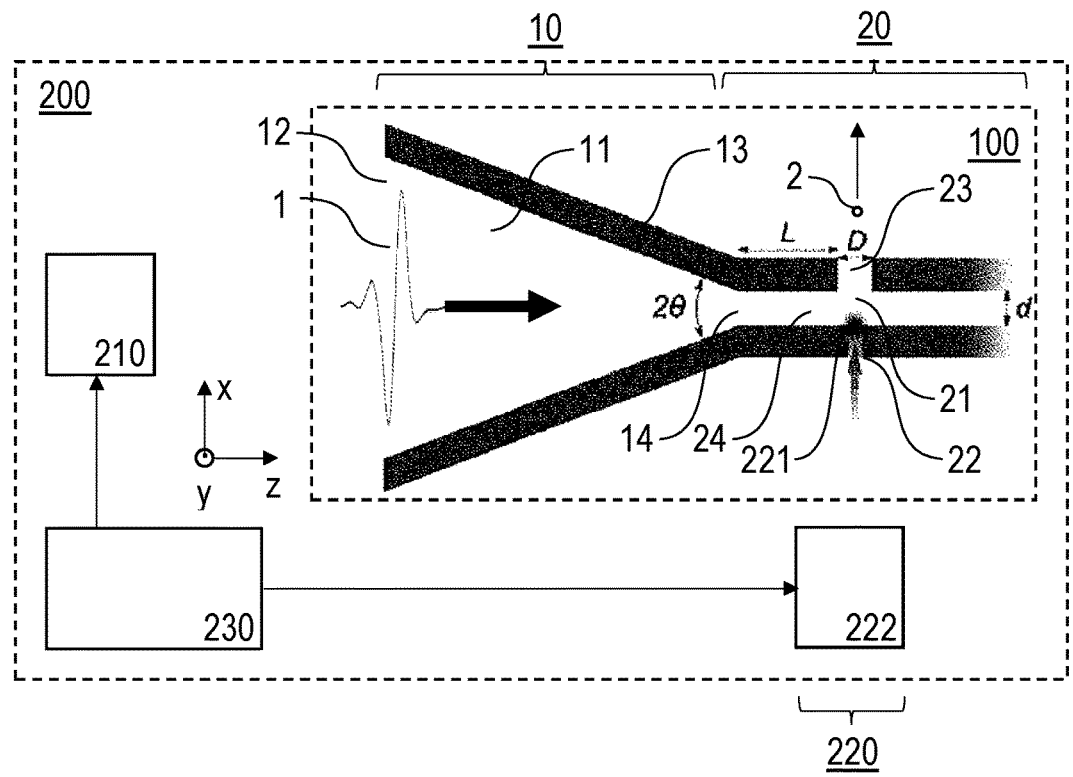
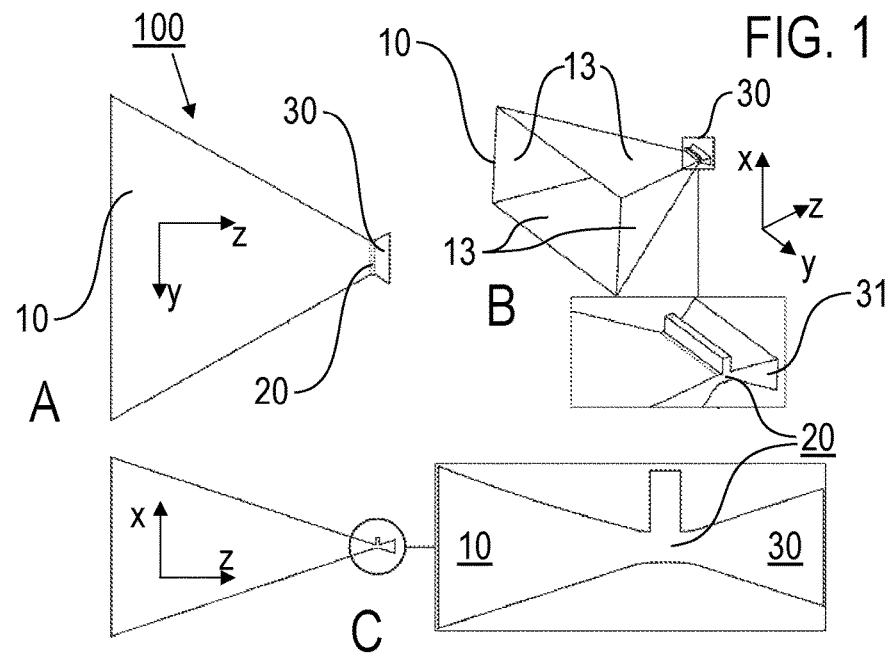
FIG. 1
FIG. 2

CHARGED PARTICLES ACCELERATOR APPARATUS, CHARGED PARTICLE GUN AND METHOD OF ACCELERATING CHARGED PARTICLES

CROSS-REFERENCE TO RELATED APPLICATIONS

This application claims priority from EP 16 000 590.6 filed Mar. 11, 2016, which is incorporated herein by reference in its entirety.

BACKGROUND OF THE INVENTION

The present invention relates to an accelerator apparatus, being configured for accelerating charged particles with pulsed radiation, preferably in a THz or RF wavelength range, in particular including a horn-shaped coupling device and a waveguide device with a particle injection section. Furthermore, the present invention relates to a charged particle gun including the accelerator apparatus, and to a method of accelerating charged particles, like e.g., electrons or protons. Applications of the invention are available in the field of compact particle accelerators, e.g., included in X-ray sources, or for electron diffraction imaging.

For describing the background of the invention, particular reference is made to the following publications:
[1] E. A. Nanni et al. in "Nature Communications" 6, 696 (2015);
[2] L. J. Wong et al. in "Optics Express" 21, 9792-9806 (2013);
[3] R. Yoder et al. in "Physical Review Special Topics-Accelerators and Beams" 8, 111301 (20051); and
[4] E. A. Nanni et al. in "Proceedings of IPAC2014", Dresden, Germany, WEOAB03, ISBN 978-3-95450-132-8, p. 1896;
[5] European patent application No. 15001303.5 (not published on the priority date of the present specification); and
[6] S.-W. Huang, et al., Opt. Lett. 38 (2013) 796-798.

Various concepts of electron acceleration using electric fields are generally known, e.g., based on a static potential (Cockcroft-Walton accelerator, Van de Graaff accelerator) or based on microwave or millimeter-wave oscillating fields (circular particle accelerators, like cyclotron, betatron, and synchrotron; or linear particle accelerators, like linac). Although these systems represent highly developed techniques with strong acceleration capabilities, they have substantial shortcomings in terms of efficiency, size and complexity of operation, resulting in limited applications, e.g., in research on basic and applied sciences. However, there is an interest in more efficient and compact devices.

Recent developments in ultrafast techniques have influenced the development of compact electron accelerators, based on e.g., dielectric laser acceleration (DLA), laser-driven plasma acceleration (LPA), and laser wake-field acceleration (LWFA). These accelerators employ strong optical fields created with high power lasers for the particle acceleration. The high operation frequency of infra-red (IR) lasers as well as the available high electric fields, e.g. based on chirped pulse amplification makes this range of the electromagnetic spectrum promising for realization of small size accelerators. However, the acceleration schemes based on optical pulses suffer from difficulties caused by the short optical wavelengths.

Another promising progress in the ultrafast techniques is the development of single cycle THz pulse sources using optical rectification. The resulting high power THz pulses can also be used to develop compact accelerators ([1] to [5]). When compared to direct optical acceleration, the benefit is then a longer wavelength and relaxed limitations in the amount of charge per bunch. According to [4] and [5], radially polarized THz pulses are coupled into a waveguide using a centrally loaded dielectric horn. However, these techniques have limitations as the waveguide used is a single mode waveguide being resonant for a central frequency of the THz pulses only. Therefore, the proposed structures are not suitable in the regime of ultrashort pulses. More accurately, the travelling wave cavities and waveguides should be fed with at least 10 to 50 cycle pulses, due to their inherent resonant behavior.

Electron acceleration is required in particular in the electron gun of a compact X-ray source. In consideration of the need for compact X-ray sources replacing available hard X-ray sources, like Free Electron Lasers (FEL), e.g., in X-ray spectroscopy and imaging, there is a particular need for compact electron accelerators and guns. In the past decade, the attempts to devise a small electron gun were mainly centered on increasing the operation frequency of the device. This leads to smaller structures functioning in shorter wavelengths. The damage threshold of the structure was the main obstacle preventing the miniaturization of electron guns. It was observed that this limitation is strongly relaxed when shorter pulses, i.e. broadband excitations are used. However, the conventional electron guns could not operate based on ultrashort pulses. This difficulty calls the need to develop new schemes for electron acceleration based on short pulses.

OBJECTS OF THE INVENTION

The objective of the invention is to provide an improved accelerator apparatus, being configured for accelerating charged particles with electro-magnetic pulsed radiation, in particular in a THz or RF wavelength range, being capable of avoiding disadvantages of conventional techniques. In particular, it is an objective of the invention to provide the accelerator apparatus with increased efficiency and broadband operation capability. Furthermore, the objective of the invention is to provide an improved charged particle gun including the accelerator apparatus, in particular an improved charged particle gun having reduced size, and an improved method of accelerating charged particles.

These objectives are solved with an accelerator apparatus, a charged particle gun and an accelerating method of the invention.

SUMMARY OF THE INVENTION

According to a first general aspect of the invention, the above objective is solved by an accelerator apparatus, being configured for accelerating charged particles with pulsed radiation, in particular in a THz or RF wavelength range, comprising a horn-shaped coupling device and a waveguide device including a particle injection section. The horn-shaped coupling device comprises at least one horn coupler (horn receiver antenna), preferably one or two horn couplers, each with an input aperture, electrically conductive, preferably metallic, walls and an output aperture. The at least one horn coupler is adapted for incoupling pulsed radiation at the input aperture and focusing the pulsed radiation along a longitudinal beam direction towards the output aperture.

Focusing is adjusted in dependency on the power of the pulsed radiation. With low power pulsed radiation, in particular single cycle THz pulsed radiation having an energy below 100 µJ, preferably below 20 µJ, or single cycle RF pulsed radiation having an energy below 10 mJ, preferably below 2 mJ, focusing down to the diffraction limit is provided. Accordingly, a point focus with a diameter in a range of 500 µm to 2 mm for a THz pulsed radiation and in a range of 5 cm to 20 cm for an RF pulsed radiation is obtained.

Alternatively, with high power pulsed radiation, in particular single cycle THz pulsed radiation having an energy above 0.5 mJ, preferably above 1 mJ, or single cycle RF pulsed radiation having an energy above 50 mJ, preferably above 100 mJ focusing to a focusing region with a diameter above the diffraction limit is provided, e.g. in a range from 2 mm to 4 mm for a THz pulsed radiation and in a range from 20 cm to 40 cm for a RF pulsed radiation. Preferably, focusing of high power pulsed radiation is adjusted such that field emission effects within the horn coupler and the waveguide device are avoided.

The waveguide device is connected to the output aperture(s) of the at least one horn coupler, and it is adapted for receiving the focused pulsed radiation. The waveguide device includes the injection section, which is configured for providing a bunch of charged particles at an acceleration point and for subjecting the charged particles to an acceleration by the pulsed radiation travelling in the waveguide device to the injection section. Furthermore, the waveguide device includes a lateral output port of the injection section for releasing the accelerated charged particles along a particle acceleration direction deviating from the longitudinal beam direction, in particular being perpendicular to the longitudinal beam direction.

According to the invention, the horn coupler has a size and form which are adapted for receiving linearly polarized single cycle pulses (or: broadband pulses) including a broadband frequency spectrum which are shaped as a linearly polarized plane wave. The term "broadband" refers to a spectral range spanned by the frequency components of the single cycle pulse, in particular to a spectral relative bandwidth of 100%. The term "single cycle pulse" refers to a pulse with a center frequency below optical frequencies, in particular in the THz range (in particular 0.3 THz to 3 THz) or in the RF range (in particular 0.3 GHz to 100 GHz having a duration equal to one oscillation cycle of the electromagnetic field at the center frequency or even sub-cycle duration. The envelope of the single cycle pulses covers the single cycle or sub-cycle duration. Additionally, the term "single cycle pulse" may include pulses having a duration of more than one cycle still having a broadband frequency characteristic, e.g., up to 2 or 3 cycles. The single cycle pulses are plane waves having a Gaussian shape along at least one direction perpendicular to the longitudinal beam direction. Furthermore, the horn coupler is adapted for the broadband focusing of the linearly polarized single cycle pulses towards the waveguide device. Furthermore, according to the invention, the waveguide device has a non-resonant broadband transmission characteristic.

Advantageously, the invention closes a conceptual gap between standard accelerators and ultrafast laser techniques. The microwave and millimeter-wave techniques, used in the conventional accelerators, are very well developed for producing continuous wave (CW) radiation. Therefore, the conventional optical accelerators are mostly narrowband devices functioning for a single frequency excitation. Examples are the widely used cascaded cavities which operate based on the resonance behavior and travelling wave accelerators, in which fields of a guided mode are employed for acceleration. Hence, direct usage of a standard accelerator geometry excited by a short pulse laser incurs wasting a large portion of the input energy.

The inventors have found that the application of the conventional THz accelerators was limited due to the bandwidth limitations introduced by the horn coupler and waveguides previously used. Contrary to the conventional techniques and as the main advantage of the invention, the inventive accelerator apparatus is configured for receiving and guiding single cycle pulses without a bandwidth limitation by adapting the horn coupler and waveguide device for broadband focusing and transmission. Thus, the single cycle pulses can be guided with improved efficiency to the injection section, and the accelerating effect of the single cycle pulses is thus increased.

Operating the accelerator apparatus with single cycle pulses results in the following further advantage. Empirical studies had initially shown that electron field emission, scaling as $f^{1/2}/\tau^{1/4}$ with f the operation frequency, and τ the pulse duration of the accelerating field, imposes a principal limit on device performance. The above approximate scaling behavior justified developments of accelerators towards higher operating frequencies and ultrafast schemes to achieve compact accelerators. However, recent studies on breakdown thresholds of various accelerators demonstrated that pulsed heating of the accelerator walls is the dominant factor limiting acceleration gradients. This conclusion confirmed the observed lower operational gradients in existing facilities when compared with predictions from the previously derived scaling laws. It was concluded that the pulse duration of the accelerating field plays the major role in the breakdown event, since it is directly linked to the pulse energy governing the pulsed heating in the device. Therefore, adapting the efficient acceleration to the use of short pulses opens new potentials to shrink down the size of accelerators.

According to a second general aspect of the invention, the above objective is solved by a charged particle gun, comprising a single cycle pulse source device being configured for delivering a sequence of linearly polarized single cycle pulses with a linearly polarized plane wave shape, an accelerator apparatus according to the above first general aspect of the invention, being arranged for receiving the sequence of single cycle pulses, and a particle source device being configured for providing charged particles (particle bunch, particle pulse) to be accelerated at the injection section of the accelerator apparatus.

Advantageously, the invention provides a compact charged particle gun, in particular electron gun which operates based on single cycle pulses. Due to the ultrashort pulse duration, the limitations caused by electrical damage of the accelerator walls are strongly relaxed. Therefore, the single-cycle pulses can potentially be focused down to very small spot sizes and make a high acceleration gradient leading to short acceleration lengths. The inventive charged particle gun can be adapted for both low energy (e.g., µJ level) and high energy (e.g., mJ level) pulses.

Preferably, the single cycle pulse source comprises a laser source device and a conversion crystal creating the single cycle pulses by optical rectification of laser pulses. Preferably, the laser source device uses a picosecond laser which functions more efficiently than a femtosecond laser by orders of magnitude, so that the overall efficiency of the acceleration with such short pulses becomes comparable to the optical acceleration. The benefit is then a longer wavelength and relaxed limitations in the amount of charge per bunch.

According to a third general aspect of the invention, the above objective is solved by a method of accelerating charged particles using an accelerator apparatus according to the above first general aspect of the invention, wherein at least one focused linearly polarized single cycle pulse is guided to the injection section of the waveguide device and at least one bunch of charged particles is created in the injection section and subjected to an acceleration by the effect of the accelerating half-cycle of the at least one focused single cycle pulse.

According to a preferred embodiment of the invention, the at least one horn coupler has an input aperture size, a longitudinal length, a horn angle and an output aperture size being adapted for focusing the single cycle pulses with a broadband focusing characteristic. Preferably, the input aperture of the horn coupler has a rectangular shape with side lengths larger than a center wavelength of the single cycle pulses, the output aperture of the horn coupler has a rectangular shape with side lengths of half the center wavelength of the single cycle pulses, and the metallic walls have the horn angle close to (equal or approximated to) the total angular spread of the incoming pulsed radiation. Advantageously, these dimensions provide the broadband focusing characteristic of the at least one horn coupler.

According to a further preferred feature of the invention, the waveguide device downstream of the at least one horn coupler has a pulse guiding section extending between the output aperture of the at least one horn coupler and the injection section. If the pulse guiding section has at least one of the following features, advantages in terms of efficient broadband coupling of the single cycle pulses to the injection section are obtained.

According to a first variant, the pulse guiding section has a length (L) being selected equal to a fraction of a center wavelength of the single cycle pulses. Advantageously, this supports a tunneling transmission of the accelerating electromagnetic field into the injection section and the drawbacks of the cut-off frequencies introduced by focusing of the incident single cycle pulses into the waveguide is reduced.

According to a second variant, the pulse guiding section and the injection section have a cross-sectional dimension (d) perpendicular to the longitudinal beam direction, which is selected such that the charged particles are able to escape from the injection section through the lateral output port before the arrival of a decelerating cycle section of the single cycle pulses. In other words, the value of the cross-sectional dimension (d) is designed so that the charged particles experience exclusively the accelerating half-cycle of the pulse. The charged particles are created at the acceleration point, which preferably is located at the inner wall of the injection section opposite to the lateral output port. The time required to reach the lateral output port is equal to or shorter than the duration of the increasing cycle section of the single cycle pulse (half pulse duration of the single cycle pulse). Accordingly, acceleration with maximum efficiency is achieved.

According to a third variant, the pulse guiding section has an inner surface which at least partially comprises a dielectric material. Advantageously, this supports the provision of the non-resonant, broadband transmission characteristic of the waveguide device. Furthermore, an adaptation of the wavefront of the single cycle pulse to the movement of the accelerated charged particle in the injection section is facilitated.

According to a further preferred embodiment of the invention, the at least one horn coupler is adapted for focusing the linearly polarized single cycle pulses according to a first focusing direction perpendicular to the longitudinal beam direction and parallel to the particle acceleration direction, preferably in a vertical plane (E-plane of the single cycle pulses). The single cycle pulse source and the at least one horn coupler are mutually aligned such that the single cycle pulses are polarized along the focusing direction. Particularly preferred, the at least one horn coupler is adapted for additionally focusing the single cycle pulses according to a second focusing direction perpendicular to the longitudinal beam direction and the first focusing direction, preferably in a horizontal plane (H-plane of the single cycle pulses). Advantageously, this further enhances the accelerating field in the injection section.

The wavefront of the linearly polarized single cycle pulses in the injection section has an extension depending on the degree of focusing the pulses, ranging from the diffraction limited point focus to the larger focusing region. The charged particles are accelerated by the effect of the whole wavefront. Thus, according to a further preferred embodiment of the invention, the wavefront of the linearly polarized single cycle pulses is matched to the motion of the charged particles accelerated along the particle acceleration direction. Matching comprises shaping the wavefront such that the charged particles are subjected to acceleration in the whole time during the motion through the wavefront.

Preferably, matching is achieved by providing a wavefront shaping structure within the horn-shaped coupling and waveguide devices. With a particularly preferred embodiment of the invention, the wavefront shaping structure comprises a stack of electrically conducting layers with dielectric inclusions, wherein the thickness and the filling factor of the layers are selected such that the arrival time of lateral sections of the wavefront of the linearly polarized single cycle pulses is matched to the location of the accelerated charged particles along the particle acceleration direction. The wavefront of the electro-magnetic radiation beam is divided into several portions, which are isolated from each other using the electrically conducting layers, e.g., thin metallic surfaces. In each layer, dielectric inclusions are added to adjust the arrival time of the pulse to the injection section. Continuous acceleration of electrons from rest throughout the whole wavefront can be achieved. Advantageously, the wavefront shaping structure allows tailoring the pulse properties to the acceleration dynamics of the particles.

According to a further preferred embodiment of the invention, the horn-shaped coupling device includes a single horn coupler on one side of the waveguide device, wherein a reflector device being arranged at the injection section in the opposite side of the horn coupler. Particularly preferred, the reflector device has a reflector distance from the injection section equal to a quarter center wavelength of the pulsed radiation, and/or the reflector device has a horn shape with a closed end wall. Advantageously, adding the reflector device at the receiving side of the structure with $\lambda/4$ distance from the charged particle injection point, enhances the accelerating field. By doing this the half-cycle of the field preceding the accelerating cycle is reversed and added to the main acceleration field. Thus, the whole cycle of the field is utilized.

Preferably, the reflector device is coupled via a reflector section with the injection section, wherein the reflector section has a length equal to the length of the pulse guiding section. Advantageously, the cut-off frequency effect can be avoided also for the receiving side of the structure. Furthermore, structuring the reflector side of the gun in form of a tapered horn with mirror symmetry relative to the left side enhances the coupling and thereby increases the acceleration gradient.

According to a further advantageous modification of the invention, the horn-shaped coupling device comprises two horn couplers, including a first horn coupler arranged for receiving the single cycle pulses and coupled with an input side of the waveguide device and a second horn coupler arranged on the receiving side of the injection section in opposite relationship to the first horn coupler. Advantageously, this configuration allows that two linearly polarized radiation beams are symmetrically coupled into the injections section in order to cancel out magnetic field effects on the charged particles.

The inventive charged particle gun preferably is adapted for a sequential operation, wherein a sequence of particle bunches is accelerated with a synchronized sequence of linearly polarized single cycle pulses. According to a preferred operational mode, the single cycle pulse source is configured for delivering all single cycle pulses of the sequence having equal carrier envelope phases (CEP). Advantageously, this results in a sequence of particle bunches subjected to equal accelerations, thus resulting in a narrow energy distribution of the accelerated particles.

According to a further preferred embodiment of the invention, the charged particle gun is equipped with a synchronization device being adapted for timely synchronizing the single cycle pulse source device and particle source device operations. The synchronization device includes a control unit driving the single cycle pulse source device and the particle source device such that the single cycle pulses arrive in the intersection section, in particular at the acceleration point or the focusing region thereof, at the time of creating the particle bunch in the intersection section. Particularly preferred, the operation of the synchronization device is conducted, while the wavefront shaping effect of the wavefront shaping structure on the inner surface of the waveguide device is taken into consideration. With this embodiment, the arrival time of the wavefront is synchronized with the creation of the particle bunch in the injection section.

Multiple variants are available for creating the particle pulse. According to a preferred feature of the invention, the particle source device comprises a photocathode electron source residing at the injection section and being provided with a photoemission laser source. The photocathode electron source has a photocathode which is located in the injection section, e.g., included in the wall of the waveguide device or arranged within the waveguide device. The photoemission laser source can be arranged for irradiating the photocathode either directly from the back, i.e., from outside of the waveguide device, or directly through the acceleration path. Alternative particle source devices comprise e.g., thermal photo-cathodes and nano-structured field emitters.

BRIEF DESCRIPTION OF THE DRAWINGS

Further details and advantages of the invention are described in the following with reference to the attached drawings, which show in:

FIG. 1: a schematic cross-sectional view illustrating a first embodiment of an accelerator apparatus according to the invention;

FIG. 2: schematic views illustrating a second embodiment of an accelerator apparatus according to the invention;

DETAILED DESCRIPTION OF PREFERRED EMBODIMENTS

Figure 3:
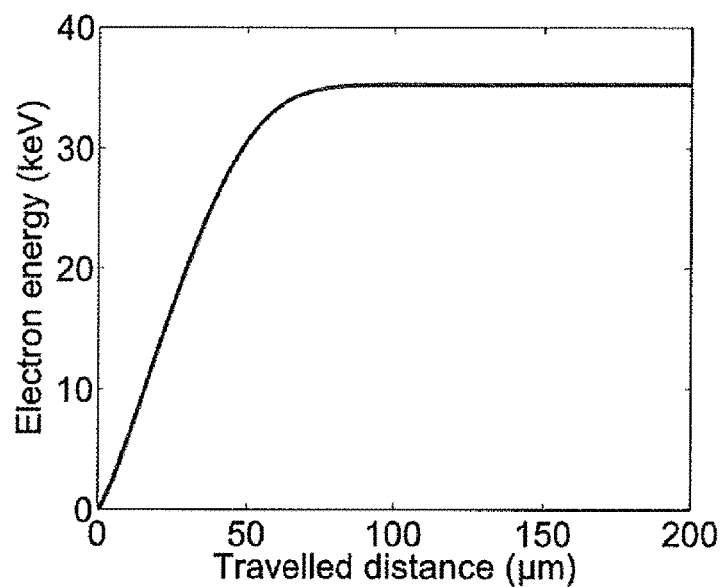
FIG. 3: a graphical illustration of the electron acceleration obtainable with the accelerator apparatus of FIG. 2 and a 20 µJ single cycle THz pulse at 0.3 THz center frequency.

Features of preferred embodiments of the invention are described in the following with exemplary reference to three embodiments having a single horn coupler, a horn coupler combined with a reflector and two horn couplers, respectively. The invention is not restricted to these embodiments. In dependency on the particular application, the invention can be implemented with modifications, e.g., with regard to the horn coupler and waveguide design, features of the pulse source device, features of the particle source device, the provision of further imaging components and the design of the particle acceleration path.

While the invention is described with reference to the preferred THz regime of operation, it is not limited by the operation frequency. Accordingly, the accelerator device can be implemented for other frequency ranges of spectrum as well, where materials with both dielectric and metallic behavior are available. This corresponds to the whole range of spectrum lower than the optical domain, in particular to the RF wavelength range.

FIG. 1 schematically illustrates a first embodiment of an accelerator apparatus 100 with a horn-shaped coupling device 10 having one horn coupler 11 and a waveguide device 20 having an injection section 21. A charged particle gun 200 includes the accelerator apparatus 100, a single cycle THz pulse source device 210, a particle source device 220 and a synchronization device 230 synchronizing the single cycle THz pulse source device 210 and the particle source device 220. Typically, at least the accelerator apparatus 100 is evacuated, i.e., a vacuum is provided in the coupling and waveguide devices 10, 20. Alternatively, the accelerator apparatus 100 can be operated e.g., with atmospheric pressure, in particular at ambient air.

With reference to the Cartesian coordinates, the accelerator apparatus 100 is arranged for an input of single cycle THz pulses 1 travelling with linear polarization along a longitudinal beam direction (z-direction). Accordingly, the electric field of the single cycle THz pulses 1 is directed in a plane perpendicular to the z-direction with the linear polarization along the x-direction, and the particles 2 created in the injection section 21 are accelerated in a particle acceleration direction (x-direction) perpendicular to the longitudinal beam direction.

The horn coupler 11 has an input aperture 12, walls 13 with metallic inner surfaces and an output aperture 14 connected with the waveguide device 20. If the single cycle THz pulses 1 are focused in x-direction only, two plane walls 13 may be sufficient which extend as a two-dimensional receiving antenna along the y-direction with an inclination angle Θ relative to the y-z-plane. Accordingly, the walls 13 span a horn angle 2Θ. Preferably, the single cycle THz pulses 1 are focused in x- and y-directions by providing four walls 13 (see FIG. 2B) which extend in the y- and x-directions with equal or different inclination angles relative to the y-z-plane and x-z-plane, respectively. In both cases, the input aperture 12 and the output aperture 14 can be considered as having rectangular shapes.

The walls 13 with a thickness of e.g., at least 50 µm, preferably 1 mm, consist of metal, e.g., copper, or they can be made of a plastic material carrying a metallic coating. The input aperture 12 has side lengths larger than a center wavelength of the THz pulsed radiation. As an example, the side lengths in x- and y-directions are 4 mm and 4 mm, respectively, for broadband focusing THz pulses with a center wavelength of 1 mm. The side lengths of the output aperture 14 equal half the center wavelength of the THz pulsed radiation, i.e., with the above example 0.05 mm and 0.5 mm in x- and y-directions, respectively. The horn angle $2\Theta$ is e.g., 14°, and the longitudinal length of the horn coupler 11 in z-direction is e. e.g., 4 mm. The side lengths of the output aperture are scalable with the radiation frequency, i.e., when the excitation is changed from THz, i.e. 0.3 THz to GHz, to e.g., 0.3 GHz, the dimensions of the device increase by a factor of 1000 and preferably the pulse energy should also increase by a factor of 1000.

The waveguide device 20 comprises a straight channel made of channel walls including an electrically conducting material and optionally a wavefront shaping structure (see below), wherein an input portion of the channel provides a THz pulse guiding section 24 and a downstream portion of the channel including an illumination port 22 and an opposite lateral output port 23 in the channel walls provides the injection section 21. The length L of the THz pulse guiding section 24 is smaller than the center wavelength of the single cycle THz pulses 1, e.g., 50 µm.

A photocathode 221 of the particle source device 220 is exposed through the illumination port 22 in the channel wall for an illumination with a photoemission laser source 222. The slit-shaped lateral output port 23 with a width D of about 100 µm for a gun operating based on single cycle THz pulses with center wavelength e.g., 1 mm, is arranged in the opposite channel wall for escaping the accelerated particles (see also FIG. 2B). At the downstream end of the waveguide device 20, single cycle THz pulses 1 are absorbed or optionally reflected (see below, FIG. 2) after the passage through the injection section 21.

The single cycle THz pulse source 210 (details not shown) comprises e.g., a picosecond pulse laser source device and a conversion crystal being adapted for creating the THz single cycle pulses by optical rectification as described e.g., in [6]. Efficient THz generation can achieve 1% level of optical to THz conversion efficiency. Thus 5 mJ level slightly sub-ps pulses can be already used to safely generate 20 µJ level single cycle THz pulses 1 typically at 300 GHz center frequency. As an example, a sequence of single cycle THz pulses 1 with a repetition rate of 1 kHz is created. Preferably, all single cycle THz pulses 1 have the same carrier-envelop phase.

The particle source device 220 comprises the photocathode 221, e.g., made of copper, which is integrated in the wall of the waveguide device 20, and the photoemission laser source 222, like a UV laser. The photocathode 221 is a thin layer, which is irradiated from the back side with the photoemission laser source 222. With a practical example, the photoemission laser source 222 is operated with a pulse duration equal to 40 fs and a spot size diameter 40 µm, and the photocathode 221 emits a particle bunch 2 with 1 pC charge in response to a pulse from the photoemission laser source 222. The photoemission laser source 222 is controlled with the synchronization device 230 such that a particle bunch 2 is provided in the injection section at the arrival time of a single cycle THz pulse 1. Optionally, the photoemission laser source 222 may be set up such that the UV laser beam illuminates the cathode surface through the slit-shaped lateral output 23.

In operation, the horn coupler 11 focuses the incoming linearly polarized single cycle THz pulses 1 down to a small spot size. The metallic boundaries provided by the walls 13 enable focusing the input beam below the diffraction limit, although an insertion loss of the incident energy is unavoidable. Subsequently, the confined THz beam of single cycle THz pulses 1 travels along the waveguide device 20 and reaches the injection section 21. The photoemission laser source 222 excites an electron bunch 2 from the surface of photocathode 221, when the accelerating field of the THz pulse 1 arrives at the injection point. If the beam of single cycle THz pulses 1 (300 GHz, center wavelength $\lambda$ about 1 mm) is focused down to the diffraction limit and the dimensions of the accelerator apparatus are e.g., $\Theta=16°$, D=500 µm, the total electric field at the focus with $2\lambda$ spot size (about 2 mm) ran reach up to about 150 MV/m. The electrons are then accelerated by the incoming THz pulse 1 and leave the acceleration region in the injection section 21 after a distance d, i.e. the separation between the two walls of the waveguide device 20. In the field of 50 MV/m, initially at rest electrons are able to move maximally $\delta x = eE\tau/m\omega \approx 7.5$ µm, being 2 to 3 orders of magnitude smaller than the center wavelength.

If the electrons are affected by the accelerating edge and at least partially also by the decelerating edge of the single cycle THz pulses 1, the efficiency of the acceleration could be restricted. For improving the efficiency, at least one of the following measures can be provided so that the electrons experience only the accelerating cycle portion (leading cycle edge). Firstly, the width of the waveguide section along the particle acceleration direction (x-direction) is selected such that the electron leave the THz pulse before the accelerating field changes sign, i.e. the decelerating edge begins. Accordingly, depending on the power of the THz pulses 1, the cross-sectional dimension (d) is equal to or smaller than the size of the THz wavefront in the injection section, e.g., in a range from 50 µm to 200 µm. Secondly, the accelerating field of the focused THz pulse can be enhanced in order to lengthen the amplitude of electron vibration, as described in the following with reference to FIG. 2.

For an adaptation of the accelerator apparatus 100 to the operation in the RF wavelength range, the dimensions of the horn coupler and the waveguide are adapted to the RF wavelengths, and the single cycle THz pulse source 210 is replaced by a single cycle RF pulse source, e.g., sources based on optoelectronic oscillators.

In FIG. 2, the accelerator apparatus 100 of the second embodiment of the invention is illustrated with a top view, e.g., along y-direction (FIG. 2A), perspective views (FIG. 2B) and side views, e.g., along x-direction (FIG. 2C). On one side of the waveguide device 20, a single horn coupler 10 is provided, while a reflector device 30 is arranged in opposite side of the horn input coupler 11. The reflector device 30 comprises a horn antenna 31, which is arranged with $\lambda/4$ distance from the injection section 21.

The horn angle of the horn antenna 31 is equal to the horn angle of the horn coupler 11, while the longitudinal length of the horn antenna 31 is selected such that the single cycle THz pulse 1 arriving at the injection section 21 is superimposed with the reflected single cycle THz pulse. This superposition leads for a half-cycle time a constructive interference between the leading edge of the pulse and the decelerating half-cycle, which due to reflection is now accelerating cycle. Thus, the acceleration field is increased.

With a practical example, the horn angle of the horn antenna 31 and the horn coupler 11 is about 60° in y-z-plane and about 32° in x-z-plane, the longitudinal lengths of the horn coupler 11 and horn antenna 31 are 4 mm and 0.26 mm, respectively, the widths of the injection section 21 are 0.55 mm in the y-direction and 0.05 mm in the x-direction, and the longitudinal length of the injection section 21 is 0.05 mm.

With these parameters, the accelerator apparatus 100 is designed for the optimum acceleration of an electron injected at instant with vertical field $E_x$=50 MV/m with zero energy.

FIG. 3 shows the energy of the injected electron in dependency on the travelled distance in x-direction. Simulations of the accelerating field profile in dependency on time, conducted by the inventors, evidence an enhancement of the acceleration gradient with a factor of 14, leading to a peak acceleration field of 708 MV/m. The final energy of the electron leaving the accelerator apparatus 100 is 35.2 keV.

The first and second embodiments of FIGS. 1 and 2 are adapted for optimum acceleration of electrons using single-cycle THz pulses with energies on the level of 20 µJ. Optimum focusing leads to peak fields as large as 700 MV/m on the photocathode 221. This value is close to or even above the field emission threshold of copper or other metallic surfaces. Therefore, further increasing the energy of the input THz beam to achieve higher acceleration rates would require another particle source. As an alternative, the third embodiment of the invention is provided for achieving efficient acceleration using high energy short pulses with around 2 mJ energy at about 300 GHz center frequency without surpassing the field emission threshold.

For the purpose of electron acceleration using high energy THz pulses, two important points are taken into account: (i) The electron may gain relativistic energy, which intensifies the effect of the transverse magnetic field of the THz pulses. This effect causes a push from the THz pulse along its propagation direction. Therefore, an electron in a configuration of FIG. 1 or 2 travels on a curved trajectory instead of a straight line. (ii) A high-energy THz beam should not be focused to small spot-sizes. Otherwise, the field emission threshold destroys the performance of the charged particle gun. Therefore, the operational spot size of the beam will be much larger than the travel distance of the electron within one half-cycle. As a consequence, to achieve an efficient acceleration, matching the phase front of the THz pulses with the electron trajectory is provided.

Figure 4:
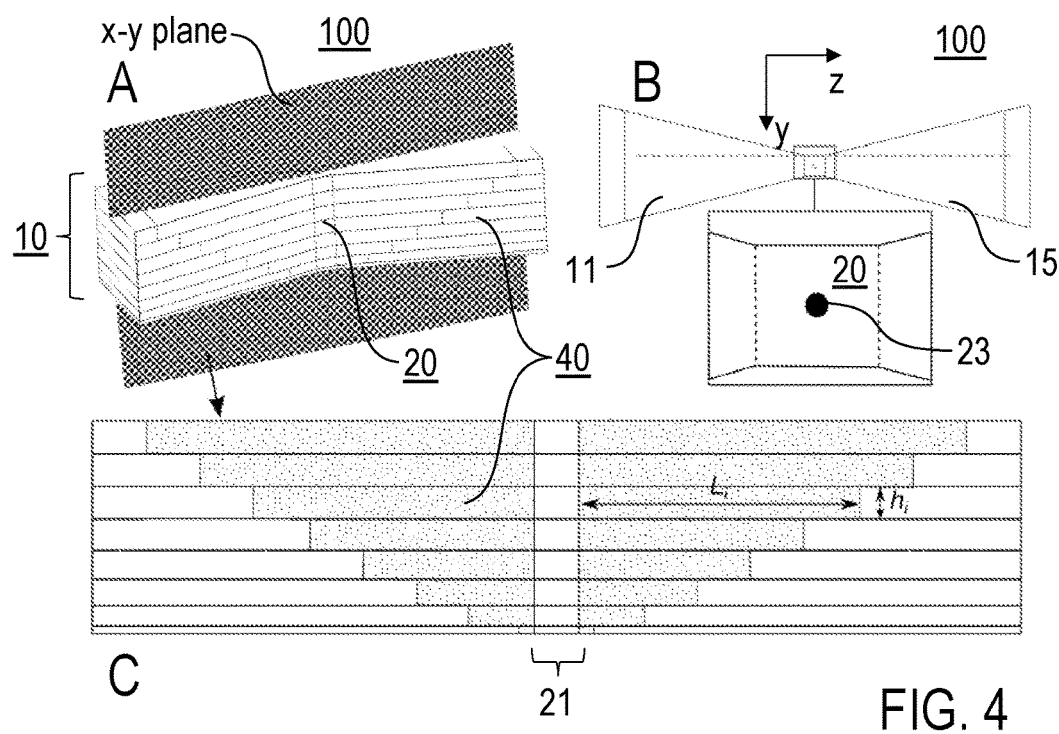
FIG. 4: schematic views illustrating a third embodiment of an accelerator apparatus according to the invention.
Figure 5:
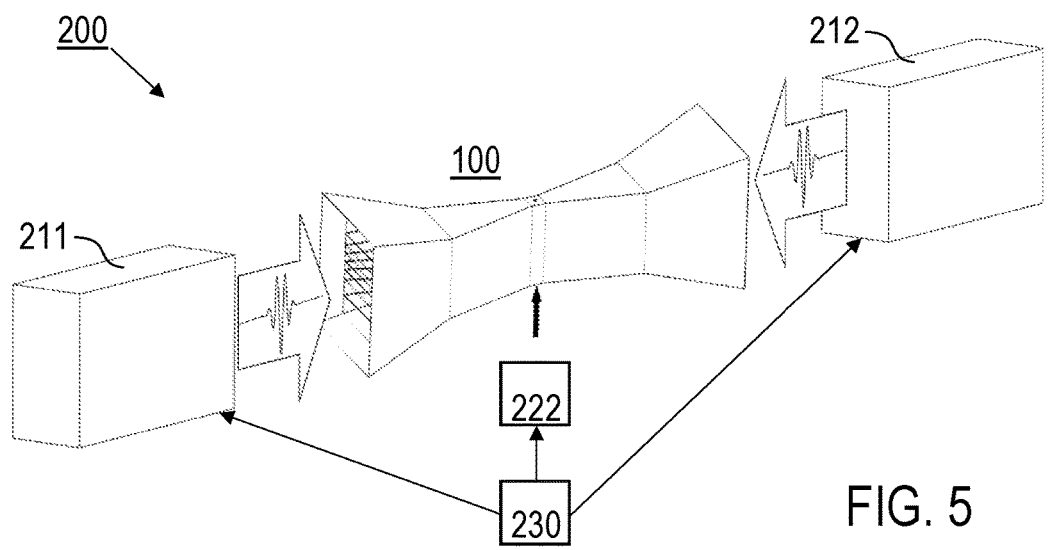
FIG. 5: schematic views illustrating a third embodiment of an accelerator apparatus according to the invention.

The configuration of the third embodiment of the invention is illustrated in FIGS. 4 and 5. In FIG. 4A, a perspective view of a wavefront shaping structure 40 of the accelerator apparatus 100 according to the third embodiment of the invention is schematically illustrated, FIG. 4B shows top views of the accelerator apparatus 100 in the y-z-plane, and FIG. 4C shows a two-dimensional presentation of the wavefront shaping structure. FIG. 5 shows a charged particle gun 200 including the accelerator apparatus 100 of FIG. 4. It is noted that the third embodiment as illustrated in FIG. 4 can be modified with the features of the embodiment of FIG. 2. Accordingly, the accelerator apparatus 100 provided with the reflector device may include the wavefront shaping structure as described in the following.

The accelerator apparatus 100 comprises the horn-shaped coupling device 10 with two horn couplers 11, 15 being coupled with the waveguide device 20. The horn couplers 11, 15 are arranged with mirror-symmetry relative to the x-y plane. Accordingly, two linearly polarized single cycle THz pulses 1 are symmetrically coupled into the waveguide device 20 in order to cancel out the magnetic field effect. The charged particle gun 200 includes the accelerator apparatus 100, the single cycle THz pulse source device 210 with two THz sources 211, 212, the particle source device 220 and the synchronization device 230 synchronizing the THz sources 211, 212 and the particle source device 220. These components of the accelerator apparatus 100 and the charged particle gun 200 can be configured as described above with reference to FIGS. 1 and 2.

Deviating from FIGS. 1 and 2, the horn couplers 11, 15 are adapted for focusing the THz pulses to a focusing region with a diameter above the diffraction limit, in particular covering the inner cross-section of the waveguide device 20. The focus point is preferably adjusted to be close to the transition region between the horn couplers 11 and 15 to the waveguide section 20. Additionally, the wavefront shaping structure 40 is arranged within the coupling and waveguide devices 10, 20. The wavefront shaping structure 40 comprises a stack of plane dielectric layers 41 which are separated from each other by support layers 42 and which have different lengths along the longitudinal beam direction (z-direction). The dielectric layers 41 extend in a plane perpendicular to the focusing direction of the horn couplers 11, 15, and they are made of e.g., quartz which has low loss characteristics in the THz regime. With an example, eight dielectric layers 41 are provided each having a thickness below 0.5 mm. The support layers 42 are made of a material having a refractive index different from the refractive index of the dielectric layers 41, e.g., a metal or a polymer, like PTFE, having a thickness of at least 5 µm.

The lengths and thicknesses of the dielectric layers 41 are selected such that the wavefront of the single cycle THz pulses is deformed, in particular inclined relative to the longitudinal beam direction, and adapted to the motion of the charged particles accelerated in the injection section. The wavefront is inclined such that portions of the wavefront having increasing distance from the photocathode 221 along the particle acceleration direction (x-direction) are increasingly delayed. Accordingly, the charged particles are accelerated by the increasing edge of the THz pulses at every phase of the motion towards the lateral output port 23.

In other words, with the multilayer structure of the wavefront shaping structure 40, the wavefront of the THz pulses is divided into several portions, which are isolated from each other using the metallic layers 42. By the dielectric layers 41, dielectric inclusions are added between the metallic layers 42 to delay the arrival time of the pulse to the acceleration region. By properly designing the filling factor of dielectrics and the thickness of each layer, continuous acceleration of electrons from rest throughout the whole wavefront can be achieved.

Figure 6:
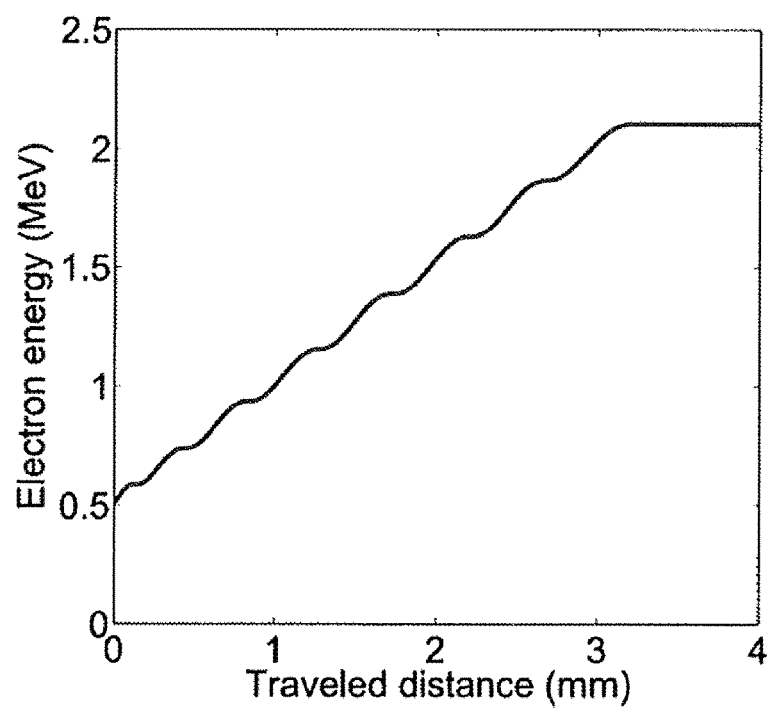
FIG. 6: a graphical illustration of the electron acceleration obtainable with the accelerator apparatus of FIGS. 4 and 5 with two 1 mJ single cycle THz pulses at 0.3 THz center frequencies.

With the illustrative two-dimensional example of FIG. 4C, two linearly polarized plane wave pulses 1 with a single-cycle temporal signature at 300 GHz and peak field 0.5 GV/m are considered which are coupled into the accelerator apparatus 100 from both sides. The eight layer configuration is designed for the considered excitation with the thickness of each layer $h_i$={0.13, 0.3, 0.39, 0.44, 0.45, 0.48, 0.49, 0.495} mm, and the length of the quartz inclusions $L_i$={0.0, 0.46, 0.91, 1.37, 1.82, 2.28, 2.74, 3.18} mm. The gap size of the injection section is considered to be 60 µm. Simulations conducted by the inventors result in the acceleration profile of an electron from rest released at the point with $E_x$=−50 MV/m to 2.1 MeV as shown in FIG. 6 presenting the energy of the electrons in dependency on travelled distance in particle acceleration direction.

In a three-dimensional configuration, e.g., according to FIG. 4A or 5, the THz pulses 1 are focused in the transverse plane (H-plane, x-z plane), resulting in a considerable increase of the efficiency. Furthermore, the wavefront shaping structure 40 comprises dielectric layers 41 made of quartz and support layers 42 made of PTFE.

The features of the invention disclosed in the above description, the drawing and the claims can be of significance both individually as well as in combination or sub-combination for the realization of the invention in its various embodiments.

What is claimed is:

1. An accelerator apparatus, being configured for accelerating charged particles with pulsed radiation, comprising:
   a horn-shaped coupling device with at least one horn coupler having an input aperture, electrically conductive walls and an output aperture and being configured for receiving the pulsed radiation at the input aperture and focusing the pulsed radiation along a longitudinal beam direction towards the output aperture, and
   a waveguide device coupled with the output aperture of the at least one horn coupler being configured for receiving the pulsed radiation focused by the horn-shaped coupling device, wherein
   the waveguide device includes an injection section being configured for providing a bunch of charged particles and for subjecting the charged particles to an acceleration by the pulsed radiation in the injection section, and
   the waveguide device includes a lateral output port being arranged at the injection section for releasing the accelerated charged particles along a particle acceleration direction, wherein
   the at least one horn coupler is configured for receiving linearly polarized single cycle pulses including a broadband frequency spectrum and being shaped as a linearly polarized plane wave and for focusing the linearly polarized single cycle pulses, and
   the waveguide device has a non-resonant broadband transmission characteristic.

2. The accelerator apparatus according to claim 1, wherein the at least one horn coupler has an input aperture size, a longitudinal length, a horn angle and an output aperture size being configured for focusing the single cycle pulses, wherein the input aperture of the horn coupler has a rectangular shape with side lengths larger than a center wavelength of the pulsed radiation, the output aperture of the horn coupler has a rectangular shape with side lengths of half the center wavelength of the pulsed radiation, and the walls have the horn angle close to a total angular spread of the incoming pulsed radiation.

3. The accelerator apparatus according to claim 1, wherein the waveguide device has a pulse guiding section extending between the output aperture of the at least one horn coupler and the injection section, wherein the pulse guiding section has at least one of the features:
   the pulse guiding section has a length (L) being selected equal to a fraction of a center wavelength of the pulsed radiation,
   the pulse guiding section and the injection section have a cross-sectional dimension (d) being selected such that the charged particles are able to escape from the injection section before an arrival of a decelerating cycle section of the single cycle pulses, and
   the pulse guiding section has an inner space which at least partially comprises a dielectric material.

4. The accelerator apparatus according to claim 1, wherein the at least one horn coupler is configured for focusing the linearly polarized single cycle pulses according to a first focusing direction perpendicular to the longitudinal beam direction and parallel to the particle acceleration direction.

5. The accelerator apparatus according to claim 4, wherein the at least one horn coupler is configured for additionally focusing the single cycle pulses according to a second focusing direction perpendicular to the longitudinal beam direction and the first focusing direction.

6. The accelerator apparatus according to claim 1, wherein an inner space of the waveguide device includes a wavefront shaping structure being configured for matching the wavefront of the linearly polarized single cycle pulses to a motion of the charged particles accelerated along the particle acceleration direction.

7. The accelerator apparatus according to claim 6, wherein the wavefront shaping structure comprises a stack of support layers with dielectric layers therebetween, wherein a thickness and a filling factor of the dielectric layers are selected such that an arrival time of lateral sections of the wavefront of the linearly polarized single cycle pulses is matched to s location of the accelerated charged particles along the particle acceleration direction.

8. The accelerator apparatus according to claim 1, further comprising a reflector device being arranged at the injection section in opposite relationship to the waveguide device.

9. The accelerator apparatus according to claim 8, wherein the reflector device has at least one of the features
   the reflector device has a reflector distance from the injection section equal to a quarter center wavelength of the pulsed radiation, and
   the reflector device has a horn shape.

10. The accelerator apparatus according to claim 1, wherein the coupling device comprises a first horn coupler coupled with the waveguide device and a second horn coupler coupled with the waveguide device in opposite relationship to the first horn coupler relative to the injection section.

11. The accelerator apparatus according to claim 1, being configured for accelerating the charged particles with the pulsed radiation having a wavelength in the THz or RF wavelength range.

12. A charged particle gun, comprising
   a single cycle pulse source device being configured for delivering a sequence of linearly polarized single cycle pulses,
   an accelerator apparatus according to claim 1, being arranged for receiving the sequence of single cycle pulses, and
   a particle source device being configured for providing charged particles to be accelerated at the injection section of the accelerator apparatus.

13. The charged particle gun according to claim 12, wherein the single cycle pulse source device is configured for delivering the sequence of single cycle pulses such that all single cycle pulses of the sequence have equal carrier envelope phases (CEP).

14. The charged particle gun according to claim 12, further comprising a synchronization device being configured for synchronizing the single cycle pulse source device and the particle source device.

15. The charged particle gun according to claim 12, wherein the particle source device comprises a photocathode electron source residing at the injection section and a photoemission laser.

16. A method of accelerating charged particles comprising the steps of:
(a) providing an accelerator apparatus being configured for accelerating charged particles with pulsed radiation, comprising:
   (i) a horn-shaped coupling device with at least one horn coupler having an input aperture, electrically conductive walls and an output aperture and being configured for receiving the pulsed radiation at the input aperture and focusing the pulsed radiation along a longitudinal beam direction towards the output aperture, and
   (ii) a waveguide device coupled with the output aperture of the at least one horn coupler being configured for receiving the pulsed radiation focused by the horn-shaped coupling device, wherein
   (iii) the waveguide device includes an injection section being configured for providing a bunch of charged particles and for subjecting the charged particles to an acceleration by the pulsed radiation in the injection section, and
   (iv) the waveguide device includes a lateral output port being arranged at the injection section for releasing the accelerated charged particles along a particle acceleration direction, wherein
   (v) the at least one horn coupler is configured for receiving linearly polarized single cycle pulses including a broadband frequency spectrum and being shaped as a linearly polarized plane wave and for focusing the linearly polarized single cycle pulses, and
   (vi) the waveguide device has a non-resonant broadband transmission characteristic,
(b) providing at least one focused linearly polarized single cycle pulse in the injection section of the waveguide device,
(c) providing at least one bunch of charged particles in the injection section, and
(d) subjecting the at least one bunch of charged particles to an acceleration by an effect of a leading edge of the at least one focused single cycle pulse.

17. The method according to claim 16, further comprising the step of focusing the at least one linearly polarized single cycle pulse to a point focus determined by a diffraction limit.

18. The method according to claim 16, further comprising the step of superimposing the at least one linearly polarized single cycle pulse with a reflected portion of the linearly polarized single cycle pulse in the injection section.

19. The method according to claim 16, further comprising the step of focusing the at least one linearly polarized single cycle pulse to a focusing region with a diameter above a diffraction limit.

20. The method according to claim 19, further comprising the step of subjecting the at least one linearly polarized single cycle pulse to a wavefront shaping.

* * * * *